(12) United States Patent
Gil

(10) Patent No.: US 6,373,080 B1
(45) Date of Patent: Apr. 16, 2002

(54) THIN FILM TRANSISTOR WITH ELECTRODE ON ONE SIDE OF A TRENCH

(75) Inventor: Gyoung-Seon Gil, Koonsan (KR)

(73) Assignee: Hynix Semiconductor, Inc., Kyoungki-do (KR)

(*) Notice: Subject to any disclaimer, the term of this patent is extended or adjusted under 35 U.S.C. 154(b) by 0 days.

(21) Appl. No.: 09/717,126

(22) Filed: Nov. 22, 2000

Related U.S. Application Data

(62) Division of application No. 09/210,774, filed on Dec. 14, 1998, now Pat. No. 6,170,815.

(30) Foreign Application Priority Data

Dec. 17, 1997 (KR) .............................. 97-70070

(51) Int. Cl.[7] ............... H01L 27/148; H01L 29/768; H01L 29/76; H01L 29/94
(52) U.S. Cl. ............. 257/220; 257/242; 257/332; 257/413
(58) Field of Search ............... 438/156, 206, 438/270, 286, 589; 257/220, 242, 321, 329, 359, 332, 412, 413

(56) References Cited

U.S. PATENT DOCUMENTS

| | | | | |
|---|---|---|---|---|
| 5,578,838 A | | 11/1996 | Cho et al. .................. 257/66 |
| 5,659,183 A | | 8/1997 | Manning et al. ............ 257/66 |
| 5,753,544 A | * | 5/1998 | Cho et al. .................. 438/166 |
| 5,869,361 A | | 2/1999 | Cho .......................... 438/156 |
| 5,933,717 A | | 8/1999 | Hause et al. ............... 438/200 |
| 5,937,283 A | * | 8/1999 | Lee ............................ 438/149 |
| 5,970,341 A | * | 10/1999 | Lin et al. ................... 438/257 |

* cited by examiner

Primary Examiner—Wael Fahmy
Assistant Examiner—William M. Brewster
(74) Attorney, Agent, or Firm—Birch, Stewart, Kolasch & Birch, LLP

(57) ABSTRACT

A thin film transistor and a fabrication method thereof in which a desired device characteristic is achieved by adjusting the lengths of a channel region and an offset region. The transistor includes a substrate in which a trench is formed, a gate electrode formed in one side in the interior of the trench, a gate insulation film formed in the substrate including the gate electrode, an active layer formed on the gate insulation film, and impurity regions formed on the active layer corresponding to the substrate. The length of the channel and offset regions are adjusted by adjusting the length and width of the trench within the substrate.

10 Claims, 3 Drawing Sheets

006
THIN FILM TRANSISTOR WITH ELECTRODE ON ONE SIDE OF A TRENCH

This application is a divisional of application Ser. No. 09/210,774, filed on Dec. 14, 1998, now U.S. Pat. No. 6,170,815 the entire contents of which are hereby incorporated by reference.

BACKGROUND OF THE INVENTION

1. Field of the Invention

The present invention relates to a thin film transistor and a fabrication method thereof, and in particular to an improved method for fabricating a thin film transistor including forming a gate electrode and impurity regions by a self-aligning process and a thin film transistor resulting therefrom.

2. Description of the Background Art

A conventional thin film transistor fabrication method is shown in FIGS. 1A–1D of the accompanying drawings.

In FIG. 1A, a gate electrode 2 is formed on an insulation substrate 1. The gate electrode 2 results from forming an impurity-doped polysilicon film on the substrate 1 by applying a chemical vapor deposition method and a photo-etching method using a gate mask.

As shown in FIG. 1B, a gate insulation film 3 is formed by depositing an insulation member on a front surface of the insulation substrate 1 including the gate electrode 2, and an active layer 4 is formed on the gate insulation film 3 using the chemical vapor deposition method.

As shown in FIGS. 1C and 1D, a photoresist member is coated on the active layer 4, and the resultant structure is subsequently patterned using the photo-etching method, thus forming a photoresist film pattern 5. Then, a p-type impurity (B, $BF_3$, etc.) or an n-type impurity (As, P, etc.) is implanted into the exposed portion of the semiconductor film (active layer 4) using the photoresist film pattern 5 as a mask, thus defining impurity regions 6a and 6b, so that the thin film transistor is fabricated. The photoresist film pattern 5 defines a channel region "b" of the active layer 4 corresponding to the gate electrode 2 and an offset region "c" between the impurity regions 6a and 6b. The impurity regions denote a source "a" and a drain "d", respectively.

In the above-described conventional thin film and a fabrication method thereof, the off current is largely varied depending on the degree of the alignment which defines the lengths of the channel region and offset region, so that the reliability and productivity of the device are decreased.

SUMMARY OF THE INVENTION

The present invention is directed to system that substantially obviates one or more of the problems experienced due to the above and other limitations and disadvantages of the related art.

Accordingly, it is an object of the present invention to provide a thin film transistor and a fabrication method thereof which overcome the aforementioned problems encountered in the background art.

It is another object of the present invention to provide a thin film transistor and a fabrication method thereof which are capable of stabilizing an off current which depends on the self-alignment method.

It is still another object of the present invention to provide a thin film transistor and a fabrication method thereof which is capable of fabricating a desired device characteristic by adjusting the lengths of a channel region and an offset region.

Other and further objects, features and advantages of the present invention will be set forth in the description that follows, and in part will become apparent from the detailed description, or may be learned by practice of the invention.

To achieve these and other advantages and in accordance with the purpose of the present invention, as embodied and broadly described, the present invention includes a thin film transistor which includes a substrate having a trench, a gate electrode formed on one side in the interior of the trench, a gate insulation film formed on the substrate including the gate electrode, an active layer formed on the gate insulation film, and impurity regions formed in the active layer corresponding to both sides of the trench.

To achieve the above objects, there is provided a method for fabrication a thin film transistor which includes the steps of forming a trench in a substrate, forming a gate electrode on one side in the interior of the trench, forming a gate insulation film on the substrate including the gate electrode, forming an active layer on the gate insulation film, forming an insulation film on the active layer corresponding to the trench, and forming impurity regions on the active layer using the insulation film as a mask.

It is to be understood that both the foregoing general description and the following detailed description are exemplary and explanatory and are intended to provide further explanation of the invention as claimed. Thus, it should be understood that the detailed description and specific examples, while indicating preferred embodiments of the invention, are given by way of example only. Various changes and modifications that are within the spirit and scope of the invention will become apparent to those skilled in the art from this detailed description. In fact, other objects, features and characteristics of the present invention; methods, operation, and functions of the related elements of the structure; combinations of parts; and economies of manufacture will surely become apparent from the following detailed description of the preferred embodiments and accompanying drawings, all of which form a part of this specification, wherein like reference numerals designate corresponding parts in various figures.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
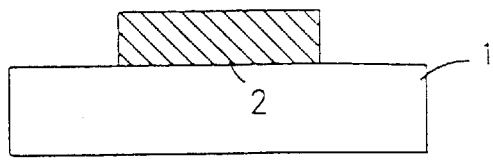
FIGS. 1A through 1D are cross-sectional views illustrating a known thin film fabrication method.
Figure 1B:
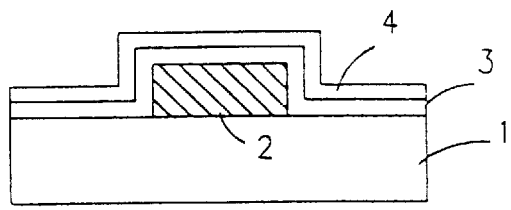
Figure 1C:
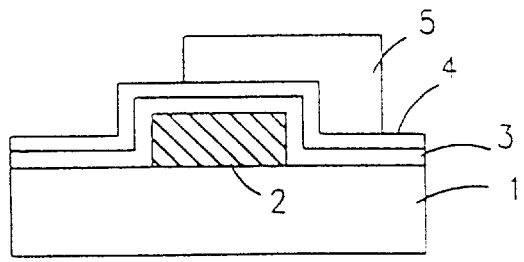
Figure 1D:
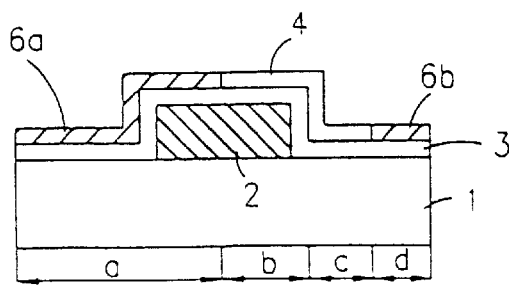

Reference will now be made in detail to the preferred embodiments of the present invention, examples of which are illustrated in the accompanying drawings. In the drawings, redundant description of like elements and processes, which are designated with like reference numerals, is omitted for brevity.

Figure 2:
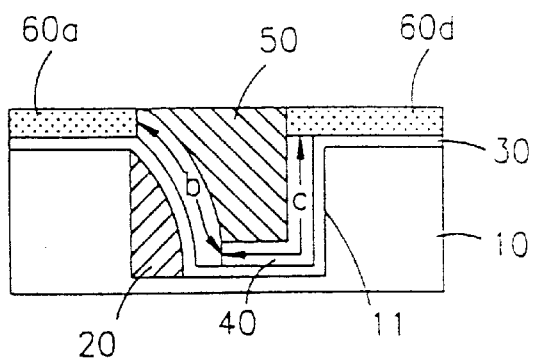
FIG. 2 is a cross-sectional view illustrating a thin film transistor according to the present invention.

As shown in FIG. 2, the thin film transistor according to the present invention includes a substrate 10 having a trench 11, a gate electrode 20 formed on one side in the interior of the trench 11, a gate insulation film 30 formed on the substrate including the gate electrode 20, an active layer 40 formed on the gate insulation film 30, an insulation film 50 formed on the active layer 40 corresponding to the trench 11, and impurity regions 60a and 60d formed in the active layer 40 corresponding to both sides of the trench 11.

The substrate 10 is formed of an insulation material and is an insulation film formed on the semiconductor member. The active layer 40 is a semiconductor film, and the upper surface of the insulation film 50 is formed in the same plane as the upper surface of the impurity regions 60a and 60d. In addition, the active layer 40 has a channel region "b" corresponding to the gate electrode 20, and an offset region "c" between the channel region "b" and the impurity regions 60a and 60d. The length of the offset region "c" is determined based on the width and depth of the trench 11.

Figure 3A:
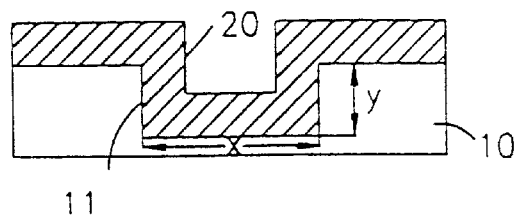
FIGS. 3A through 3G are cross-sectional views illustrating a thin film fabrication method according to the present invention.

FIGS. 3A through 3G illustrate the thin film transistor fabrication method according to the present invention. As shown therein, the trench 11 is formed by etching the substrate 10, and the impurity-doped polysilicon film 20 is formed on the insulation substrate 10 including the trench 11 by the chemical vapor deposition method. The substrate 10 is generally formed of an insulation member, or it may be formed otherwise such that the insulation film is formed on the semiconductor member. In FIG. 3A, reference characters X and Y denote the width and depth of the trench 11, respectively.

Figure 3B:
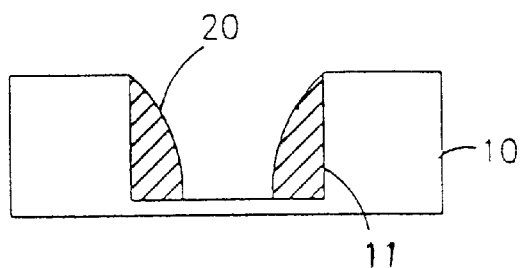

As shown in FIG. 3B, the gate electrode 20 is formed in both sides in the interior of the trench 11 by anisotropic-etching the polysilicon film 20.

Figure 3C:
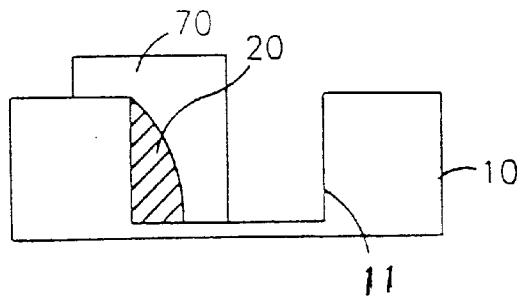

As shown in FIG. 3C, the gate electrode 20 formed in one side in the interior of the trench 11 is masked by a photoresist film pattern 70. Then, the photoresist film pattern 70 is removed.

Figure 3D:
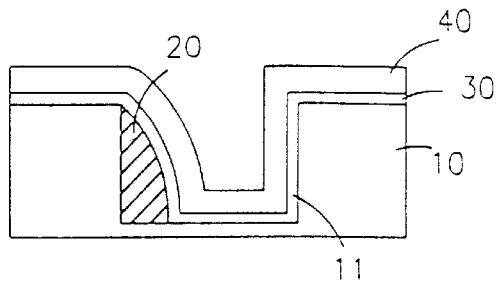

As shown in FIG. 3D, the insulation member is deposited on the substrate 10 including the gate electrode 20, thus forming a gate insulation film 30, and the active layer 40 is formed on the gate insulation film 13 by the chemical vapor deposition method. $SiO_2$ and $SiN_4$ or the combination of the same are generally used as the insulation member. The gate insulation film 30 may be formed by oxidizing a portion of the gate electrode 20 remaining after the etching used to form gate electrode 20, instead of the deposition method with respect to the deposition member.

Figure 3E:
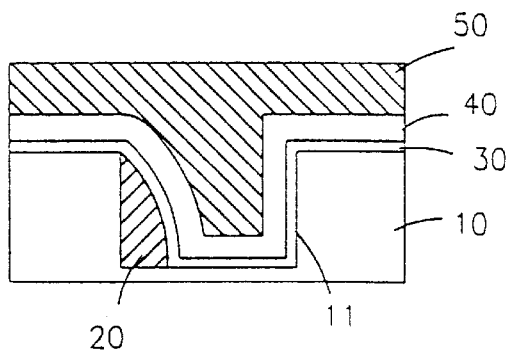

As shown in FIG. 3E, the insulation film 50 is formed on the active layer 40. The insulation film 50 is formed by coating SOG (Spin On Glass), which is a planarizing member, and then performing a heat treatment.

Figure 3F:
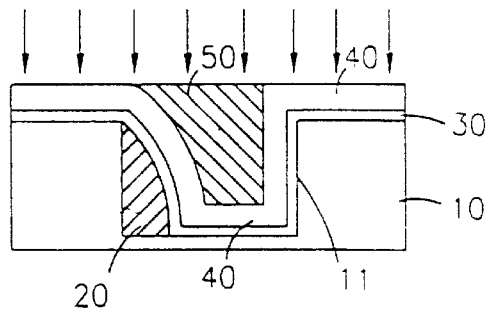
Figure 3G:
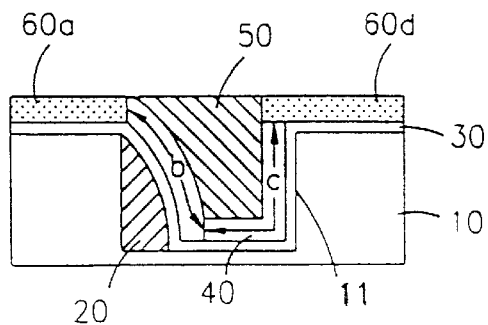

As shown in FIGS. 3F and 3G, the insulation film 50 is etched-back so that both lateral surfaces of the active layer 40 is exposed. Thereafter, As, P, etc., which are an n-type impurity, are implanted into the active layer 40, thus forming the impurity regions 60a and 60d of the NMOS transistor, or the impurity regions 60a and 60d of the PMOS transistor are formed by ion-implanting B, $BF_2$, etc. which are a P-type impurity, thus fabricating the thin film transistor. A channel region "b" corresponding to the gate electrode 20 is formed on the active layer 40, and an offset region "c" is formed between the channel region "b" and the impurity regions 60a and 60d.

As described above, in the fabrication method of the thin film transistor according to the present invention, it is possible to reduce the number of fabrication processes by forming the impurity regions using a self-aligning method without additionally using a mask, where the operational characteristic of the device is stabilized in accordance with the lengths of the channel region and offset region by adjusting the width and depth of the trench.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A thin film transistor, comprising:

a substrate having a trench;

a gate electrode located on one side in the interior of the trench and entirely within the trench;

a gate insulation film located on the substrate and the gate electrode;

an active layer located on at least a portion of the gate insulation film; and impurity regions located on portions of the gate insulation film corresponding to both sides of the trench.

2. The thin film transistor of claim 1, wherein said substrate is an insulation member.

3. The thin film transistor of claim 1, wherein said substrate is an insulation film located on a semiconductor member.

4. The thin film transistor of claim 1, wherein said active layer is a semiconductor film.

5. The thin film transistor of claim 1, further comprising an insulation film located on a portion of the active layer corresponding to the trench.

6. The thin film transistor of claim 1, wherein an upper surface of the insulation film and upper surfaces of the impurity regions are each located on a single plane.

7. The thin film transistor of claim 1, wherein said active layer includes a channel region corresponding to the gate electrode.

8. The thin film transistor of claim 1, wherein an offset region is located between the channel region of the active layer and the impurity regions.

9. The thin film transistor of claim 8, wherein a length of the offset region is dependent on a width and depth of the trench.

10. The thin film transistor of claim 1, wherein a portion of said active layer corresponding to the gate electrode is a channel region, and a portion of said active layer corresponding to a lower surface and at least one lateral surface of the trench is an offset region.

* * * * *